United States Patent [19]
Jackson

[11] Patent Number: 4,467,017
[45] Date of Patent: Aug. 21, 1984

[54] MEASUREMENT DEVICE FOR INDICATING THE STATE-OF-CHARGE OF ELECTROLYTIC STORAGE TYPE CELLS

[76] Inventor: Terry R. Jackson, P.O. Box 6079, Hay St. E., Perth, Australia

[21] Appl. No.: 367,117

[22] Filed: Apr. 9, 1982

[30] Foreign Application Priority Data

Apr. 14, 1981 [AU] Australia .............................. PE8487

[51] Int. Cl.³ .......................................... H01M 10/48
[52] U.S. Cl. ......................................... 429/9; 429/91
[58] Field of Search ....................... 429/92, 93, 72, 91, 429/9

[56] References Cited

U.S. PATENT DOCUMENTS

| | | | |
|---|---|---|---|
| 1,373,951 | 4/1921 | Cox et al. | 429/93 |
| 1,604,210 | 10/1926 | West | 429/93 |
| 3,758,345 | 9/1973 | Toth | 429/123 |
| 4,308,322 | 12/1981 | Hammar | 429/72 |

FOREIGN PATENT DOCUMENTS 1074216 7/1967 United Kingdom .................... 429/9

Primary Examiner—M. L. Andrews
Attorney, Agent, or Firm—Harness, Dickey & Pierce

[57] ABSTRACT

A device for providing a measure of the state of charge of a storage electrolytic cell comprising secondary electrolytic cell located within the electrolyte of a storage electrolytic cell said secondary electrolytic cell providing an e.m.f. which is dependant upon a characteristic of the electrolyte which varies proportionally with variation in the state of charge of the storage electrolytic cell.

13 Claims, 1 Drawing Figure

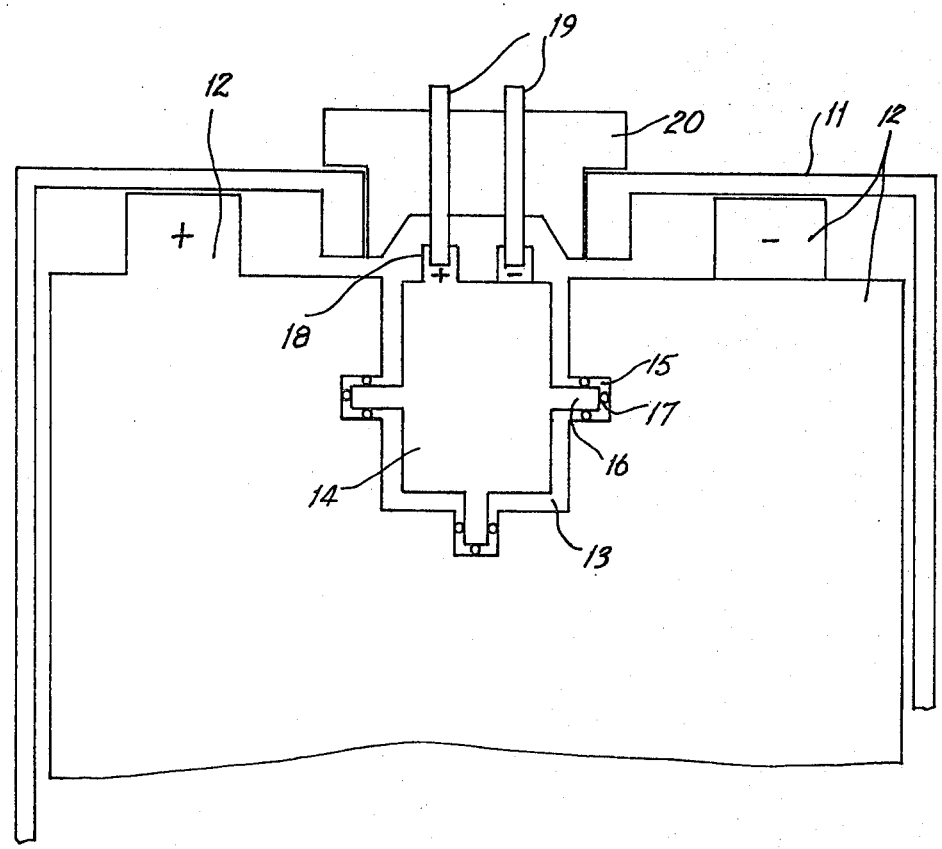

MEASUREMENT DEVICE FOR INDICATING THE STATE-OF-CHARGE OF ELECTROLYTIC STORAGE TYPE CELLS

This invention relates to electrolytic storage cells.

Such cells are currently under serious examination in relation to their use to provide power for electric motors in replacement of conventional internal combustion engines. However, a difficulty with use of each alternatives resides in the lack of an adequate means for determining the amount of charge available at a particular point in time. It has been the current practice to provide an indication of the degree of charge in a set of batteries used with an electric motor by measuring the loaded circuit voltage of the batteries. This method is not satisfactory when the battery is under load since the available charge depends not only on the immediate load but also, upon the past load history of the battery.

It has been previously known to measure the state of charge of a lead-acid battery by measuring the specific gravity of the electrolyte using a hydrometer. However, if one wishes to obtain a continuous measurement of a state of charge of a cell, the use of a hydrometer or similar device located within the electrolyte to provide a continuous signal by means of a suitable transducer involves considerable problems one of which includes the variation in electrolyte level in the cell as it is used and also with movement if the cell is located in a moving station such as a vehicle.

It is an object of this invention to provide a means of indicating the state of charge of an accumulator or storage battery which is more accurate than that provided by measuring the open circuit voltage of the battery and is less subject to changes in electrolyte level.

In one form the invention resides in a device for providing a measure of the state of charge of a storage electrolytic cell comprising secondary electrolytic cell located within the electrolyte of the storage electrolytic cell said secondary electrolytic cell providing an e.m.f. which is dependant upon a characteristic of the electrolyte which varies proportionally with a variation in the state of charge of the storage electrolytic cell.

According to a preferred feature of the invention, the secondary electrolytic cell comprises at least two electrodes of the same composition as the electrodes of the storage electrolytic cell.

According to a preferred feature of the last mentioned feature, the storage electrolytic cell comprises a lead-acid cell.

According to a preferred feature of the invention the secondary electrolytic cell comprises a cell measuring the concentration of hydrogen ions in the electrolyte.

According to a preferred feature of the last mentioned feature, the electrode of the secondary electrolytic cell utilises a palladium/hydrogen electrode.

According to a preferred feature of the invention a number of storage cells are connected together to provide a battery of cells and each cell incorporates an electrolytic cell of the form described above.

The invention will be more fully described in the light of the following description of several specific embodiments. The description is made with reference to the accompanying drawing which is a schematic sectional part elevation of a lead-acid storage cell according to one embodiment.

The embodiment is directed towards a state of charge measuring device for use with lead-acid storage batteries. According to the embodiment, at least one cell of a battery incorporates within it a smaller cell having electrodes of the same composition as those of the main storage cell. As shown in the drawing, the storage cell comprises a casing 11 supporting two sets of electrodes 12 wherein the plates of each set are connected in series to a positive or negative terminal and the plates of each set are positioned alternately in the casing. Two adjacent electrodes 12 are formed along their upper edge with a cut out 13 which accommodates a smaller electrode 14 having the same composition as the main electrode 12. The polarity of the smaller electrode 14 corresponds with that of the host plate. To locate the smaller electrode in position the cut-out is formed along its side with further cut-outs 15 which receive protrusions 16 formed in the side of the smaller electrode. To ensure that the smaller electrode 14 remains isolated from the host electrode 12 suitable insulating supports 17 are located between the protrusions 16 and the sides of the smaller cut-outs 15. Each smaller electrode is formed with an upstanding tag 18 which is engaged by a contact 19 fixed into a ventilating cap 20 which is removably mounted to the top of the casing 11.

It has been found by experimentation that the voltage produced by the small electrolytic cells which consists the smaller electrodes 14 corresponds directly with the condition of the electrolyte which in turn directly relates to the state of charge of the cell. If desired, a small electrolytic cell of the form described above may be located in each cell of a battery of lead-acid storage cells or maybe located in a representative sample of such cells. If more than one cell is used in a battery, a means of periodically measuring the voltage of each cell may be used together with an averaging means to provide an average state of charge for each cell. Since the small electrolytic cell is not connected to a current carrying circuit, the voltage output will be directly dependent upon the state of the electrolyte in the cell provided that such level ensures contact of the smaller electrodes with the electrolyte. In addition, the output of the cell is not effected by shaking, stirring or swirling of the electrolyte and is not effected by the current drain on the battery.

According to a preferred feature of the embodiment, the storage cell incorporates within it a means of circulating the electrolyte to prevent stratification which may produce spurious results from the small electrolytic cell. Such circulating means may comprise bubbling of gas through the cell or the use of a small impeller in the cell.

According to a further embodiment the electrolytic cell may be located at a position outside the storage cell and electrolyte from the storage cell is pumped through the small electrolytic cell in order for that cell to provide an indication of the condition of the electrolyte. Such an arrangement would also reduce the phenomenon of stratification of the electrolyte in the cell.

Since the electrodes of the small electrolytic cell will suffer from some decomposition changes over time, it is necessary to periodically regenerate the measuring cell electrodes. This regeneration can be effected when recharging the storage cell.

It may be necessary to vary the structure of each of the smaller electrodes in order to be able to obtain accurate measurements within a short period of time, since it has been found that if the electrodes used in the measurement cell correspond with those used within the storage cell, a relatively slow response is produced, therefore, while the composition of the electrodes must be the same, their constructional details need not be the same.

According to a further embodiment of the invention to the measurement cell incorporates a palladium/hydrogen electrode to measure the hydrogen ion concentration of the electrolyte.

Since the relationship of the state-of-charge of a cell with the specific gravity of the electrolyte varies with temperature a further preferred embodiment utilises means of measuring the temperature of the electrolyte or the casing wall and may also incorporate a compensation means associated with the output of the measuring cell to compensate for temperature variations.

The embodiments described above will also provide an indication of the state of charge of a cell when under recharge. Therefor, it is possible to utilise the output from each of the embodiments to control the flow of current to a cell when under recharge.

It should be appreciated that the scope of the present invention need not be limited to the particular scope of the embodiments described above. In particular the invention need not be limited to the particular form of measurement cell described above.

I claim:

1. A device for providing a measure of the state of charge of a storage electrolytic cell having a case containing an electrolyte, at least one positive plate immersed in said electrolyte and providing a positive post, and at least one negative plate immersed in said electrolyte and providing a negative post, comprising a test electrolytic cell located within said electrolyte of said storage electrolytic cell said positive plate and said negative plate of said storage electrolytic cell each have a respective recess formed therein, said test electrolytic cell comprising a positive plate received in said storage cell positive plate recess and a negative plate received in said storage cell negative plate recess, said positive plates and said negative plates of said storage and test cells being insulated from each other, said test electrolytic cell providing an e.m.f. dependent upon the state of charge of said storage electrolytic cell.

2. A device as claimed at claim 1 wherein the plates of the test electrolytic cell are of the same composition as the plates of the storage cell and said test cell plates are connected to a means for providing a measure of the e.m.f. produced thereby.

3. A device as claimed at claim 2 wherein the storage electrolytic cell comprises a lead-acid cell.

4. A device as claimed at claim 1 wherein the test electrolytic cell provides an e.m.f. which is a measure of concentration of hydrogen ions in the electrolyte.

5. A device as claimed at claim 4 wherein one of the test cell plates comprises a palladium hydrogen electrode.

6. A device as claimed at claim 1 wherein means is provided in said storage electrolyte cell to circulate the electrolyte.

7. A device as claimed at claim 6 wherein said means for circulating comprises means for introducing a gas into the bottom of the storage electrolyte.

8. A device as claimed at claim 5 wherein means is provided in said storage electrolyte cell to circulate the electrolyte.

9. A device as amended at claim 8 wherein said means for circulating comprises means for introducing a gas into the bottom of the storage electrolyte.

10. A battery of storage electrolytic cells wherein at least one cell thereof incorporates a device of the form as claimed at claim 3.

11. A battery of storage electrolytic cells as claimed at claim 9 having several cells with said devices therein wherein means is provided to sequentially measure the e.m.f. produced by each device.

12. A battery of storage electrolytic cells wherein at least one cell thereof incorporates a device of the form as claimed at claim 5.

13. A battery of storage electrolytic cells as claimed at claim 10 having several cells with said devices therein wherein means is provided to sequentially measure the e.m.f. produced by each device.

* * * * *